United States Patent
Fujii et al.

(10) Patent No.: US 9,318,260 B2
(45) Date of Patent: Apr. 19, 2016

(54) CAPACITOR-MOUNTED STRUCTURE AND CAPACITOR

(71) Applicant: Murata Manufacturing Co., Ltd., Nagaokakyo-shi, Kyoto-fu (JP)

(72) Inventors: Yasuo Fujii, Nagaokakyo (JP); Toshiki Tanaka, Nagaokakyo (JP)

(73) Assignee: Murata Manufacturing Co., Ltd., Kyoto (JP)

(*) Notice: Subject to any disclaimer, the term of this patent is extended or adjusted under 35 U.S.C. 154(b) by 75 days.

(21) Appl. No.: 14/499,495

(22) Filed: Sep. 29, 2014

(65) Prior Publication Data

US 2015/0090484 A1    Apr. 2, 2015

(30) Foreign Application Priority Data

Oct. 1, 2013   (JP) .................................. 2013-206185
Jun. 25, 2014  (JP) .................................. 2014-130266

(51) Int. Cl.

| | |
|---|---|
| H05K 1/16 | (2006.01) |
| H01G 4/005 | (2006.01) |
| H01G 4/228 | (2006.01) |
| H01G 4/248 | (2006.01) |
| H01G 2/06 | (2006.01) |
| H05K 1/18 | (2006.01) |
| H05K 1/11 | (2006.01) |
| H01G 4/30 | (2006.01) |
| H01G 4/232 | (2006.01) |
| H05K 3/34 | (2006.01) |

(52) U.S. Cl.
CPC ................ *H01G 2/065* (2013.01); *H01G 4/232* (2013.01); *H01G 4/30* (2013.01); *H05K 1/111* (2013.01); *H05K 1/181* (2013.01); *H05K 3/3436* (2013.01); *H05K 2201/09427* (2013.01); *H05K 2201/10015* (2013.01); *H05K 2201/10636* (2013.01); *H05K 2201/2045* (2013.01); *Y02P 70/611* (2015.11)

(58) Field of Classification Search
CPC ............ H05K 2201/09427; H05K 2201/2045; H05K 2201/10636
USPC ........................ 174/260; 361/303, 306.1, 310
See application file for complete search history.

(56) References Cited

U.S. PATENT DOCUMENTS

| | | | |
|---|---|---|---|
| 2004/0183147 A1* | 9/2004 | Togashi ................. | H01G 2/065 257/414 |
| 2007/0121275 A1* | 5/2007 | Takashima ............. | H01G 4/385 361/311 |
| 2010/0033938 A1 | 2/2010 | Kitagawa et al. | |
| 2013/0321981 A1* | 12/2013 | Ahn ........................ | H01G 4/30 361/321.2 |

FOREIGN PATENT DOCUMENTS

| | | |
|---|---|---|
| JP | 2010-045085 A | 2/2010 |
| WO | 2010/137379 A1 | 12/2010 |

* cited by examiner

*Primary Examiner* — Sherman Ng
(74) *Attorney, Agent, or Firm* — Keating & Bennett, LLP

(57) ABSTRACT

A monolithic-capacitor-mounted structure satisfies Lc>Wc and Lx/Wx<Lc/Wc, where Lx denotes a distance between a first-lengthwise outermost portion of a first-lengthwise outermost one of first through fourth pads and a second-lengthwise outermost portion of a second-lengthwise outermost one of the pads; Wx denotes a distance between a first-widthwise outermost portion of a first-widthwise outermost one of the pads and a second-widthwise outermost portion of a second-widthwise outermost one of the pads; Lc denotes a distance between a first-lengthwise outermost portion of a first-lengthwise outermost one of external electrodes and a second-lengthwise outermost portion of a second-lengthwise outermost one of the external electrodes; and Wc denotes a distance between a first-widthwise outermost portion of a first-widthwise outermost one of the external electrodes and a second-widthwise outermost portion of a second-widthwise outermost one of the external electrodes.

20 Claims, 21 Drawing Sheets

CAPACITOR-MOUNTED STRUCTURE AND CAPACITOR

BACKGROUND OF THE INVENTION

1. Field of the Invention

The present invention relates to a capacitor-mounted structure and a capacitor.

2. Description of the Related Art

Capacitors such as monolithic ceramic capacitors have been used in a large number of electronic components.

When a voltage applied to a monolithic ceramic capacitor changes, the monolithic ceramic capacitor may be bent. The bending of the monolithic ceramic capacitor is transmitted to a circuit board on which the monolithic ceramic capacitor is mounted with a bonding member and, consequently, the circuit board vibrates. When the frequency of vibrations of the circuit board falls within the range of approximately 20 Hz to 20 kHz, the vibrations of the circuit board are perceived by human beings as a sound. This sound in the range of frequencies perceivable by human beings is referred to as "acoustic noise". A variety of electronic devices including television sets, personal computers, and mobile communication terminals such as mobile phones have this acoustic noise problem.

In order to reduce the acoustic noise, Japanese Unexamined Patent Application Publication No. 2010-45085 describes a method for arranging two out of four monolithic ceramic capacitors on a printed circuit board along a first axis and arranging the remaining two monolithic ceramic capacitors along a second axis that is perpendicular to the first axis.

The method described in Japanese Unexamined Patent Application Publication No. 2010-45085, however, requires four monolithic ceramic capacitors and thus has restrictions such as the requirement of a large space for mounting four monolithic ceramic capacitors. Since electronic components for, particularly, mobile terminals such as mobile phones have been assembled highly densely, the method described in Japanese Unexamined Patent Application Publication No. 2010-45085 may not be applicable in some cases. Thus, a new method for reducing acoustic noise has been desired.

SUMMARY OF THE INVENTION

Preferred embodiments of the present invention significantly reduce or prevent acoustic noise in a capacitor-mounted structure.

A monolithic-capacitor-mounted structure according to a first aspect of various preferred embodiments of the present invention is a monolithic-capacitor-mounted structure that includes a monolithic capacitor and a substrate including a mount surface on which the monolithic capacitor is mounted. The monolithic capacitor includes a capacitor body, a plurality of internal electrodes, and a plurality of external electrodes. The capacitor body includes first and second main surfaces, first and second side surfaces, and first and second end surfaces. The first and second main surfaces are parallel or substantially parallel to the mount surface and extend in a lengthwise direction and a widthwise direction. The first and second side surfaces are perpendicular or substantially perpendicular to the mount surface and extend in a thickness direction and the lengthwise direction. The first and second end surfaces extend in the thickness direction and the widthwise direction. The plurality of internal electrodes are disposed inside the capacitor body. At least a portion of each of the external electrodes is disposed on at least any one of the side surfaces and the end surfaces of the capacitor body. The plurality of external electrodes are each electrically connected to any of the internal electrodes. A plurality of pads coupled to at least one of the external electrodes using a bonding member are disposed on the mount surface of the substrate. The plurality of pads include first and second pads and third and fourth pads. The first and second pads at least partially face each other in the lengthwise direction. The third and fourth pads are disposed between the first pad and the second pad in the lengthwise direction. The third and fourth pads at least partially face each other in the widthwise direction. Relationships $Lc > Wc$ and $Lx/Wx < Lc/Wc$ are satisfied, where Lx denotes a distance between an outermost portion of an outermost one of the first to fourth pads in a first lengthwise direction, which is included in the lengthwise direction, and an outermost portion of an outermost one of the first to fourth pads in a second lengthwise direction, which is included in the lengthwise direction, in other words, Lx denotes a distance between outermost portions of the first to fourth pads in the lengthwise direction; Wx denotes a distance between an outermost portion of an outermost one of the first to fourth pads in a first widthwise direction, which is included in the widthwise direction, and an outermost portion of an outermost one of the first to fourth pads in a second widthwise direction, which is included in the widthwise direction, in other words, Wx denotes a distance between outermost portions of the first to fourth pads in the widthwise direction; Lc denotes a distance between an outermost portion of an outermost one of the plurality of external electrodes in the first lengthwise direction and an outermost portion of an outermost one of the plurality of external electrodes in the second lengthwise direction, in other words, Lc denotes a distance between outermost portions of the plurality of external electrodes in the lengthwise direction; and Wc denotes a distance between an outermost portion of an outermost one of the plurality of external electrodes in the first widthwise direction and an outermost portion of an outermost one of the plurality of external electrodes in the second widthwise direction, in other words, Wc denotes a distance between outermost portions of the plurality of external electrodes in the widthwise direction.

In the monolithic-capacitor-mounted structure according to the first aspect of various preferred embodiments of the present invention, when viewed in a plan, the first and second pads are located between one end of the capacitor body in the widthwise direction and the other end of the capacitor body in the widthwise direction, and when viewed in a plan, the third and fourth pads are located between one end of the capacitor body in the lengthwise direction and the other end of the capacitor body in the lengthwise direction.

In the monolithic-capacitor-mounted structure according to the first aspect of various preferred embodiments of the present invention, the plurality of external electrodes preferably include a first external electrode, at least a portion of which is located on the first end surface; and a second external electrode, at least a portion of which is located on the second end surface. Here, the first external electrode preferably is coupled to the first pad and the second external electrode preferably is coupled to the second pad.

The plurality of external electrodes preferably further include a third external electrode, at least a portion of which is located on the first side surface; and a fourth external electrode, at least a portion of which is located on the second side surface. Here, the third external electrode preferably is coupled to the third pad and the fourth external electrode preferably is coupled to the fourth pad. The third external electrode and the fourth external electrode preferably are connected to each other on the second main surface.

A monolithic-capacitor-mounted structure according to a second aspect of various preferred embodiments of the present invention is a monolithic-capacitor-mounted structure that includes a monolithic capacitor and a substrate including a mount surface on which the monolithic capacitor is mounted. The monolithic capacitor includes a capacitor body, a plurality of internal electrodes, and a plurality of external electrodes. The capacitor body includes first and second main surfaces, first and second side surfaces, and first and second end surfaces. The first and second main surfaces are parallel or substantially parallel to the mount surface and extend in a lengthwise direction and a widthwise direction. The first and second side surfaces are perpendicular or substantially perpendicular to the mount surface and extend in a thickness direction and the lengthwise direction. The first and second end surfaces extend in the thickness direction and the widthwise direction. The plurality of internal electrodes are disposed inside the capacitor body. At least a portion of each of the external electrodes is disposed on at least any one of the side surfaces and the end surfaces of the capacitor body. The plurality of external electrodes are each electrically connected to any of the internal electrodes. A plurality of pads coupled to at least one of the external electrodes using a bonding member are disposed on the mount surface of the substrate. The plurality of pads include first and second pads and third and fourth pads. The first and second pads at least partially face each other in the lengthwise direction. The third pad at least partially faces the first pad in the widthwise direction. The fourth pad at least partially faces the second pad in the widthwise direction. The fourth pad at least partially faces the third pad in the lengthwise direction. Relationships Lc>Wc and Lx/Wx<Lc/Wc are satisfied, where Lx denotes a distance between an outermost portion of an outermost one of the first to fourth pads in a first lengthwise direction, which is included in the lengthwise direction, and an outermost portion of an outermost one of the first to fourth pads in a second lengthwise direction, which is included in the lengthwise direction, in other words, Lx denotes a distance between outermost portions of the first to fourth pads in the lengthwise direction; Wx denotes a distance between an outermost portion of an outermost one of the first to fourth pads in a first widthwise direction, which is included in the widthwise direction, and an outermost portion of an outermost one of the first to fourth pads in a second widthwise direction, which is included in the widthwise direction, in other words, Wx denotes a distance between outermost portions of the first to fourth pads in the widthwise direction; Lc denotes a distance between an outermost portion of an outermost one of the plurality of external electrodes in the first lengthwise direction and an outermost portion of an outermost one of the plurality of external electrodes in the second lengthwise direction, in other words, Lc denotes a distance between outermost portions of the plurality of external electrodes in the lengthwise direction; and Wc denotes a distance between an outermost portion of an outermost one of the plurality of external electrodes in the first widthwise direction and an outermost portion of an outermost one of the plurality of external electrodes in the second widthwise direction, in other words, Wc denotes a distance between outermost portions of the plurality of external electrodes in the widthwise direction.

In the monolithic-capacitor-mounted structure according to the second aspect of various preferred embodiments of the present invention, the first pad preferably is disposed so as to be overlapped by a first corner portion of the capacitor body when viewed in a plan, the second pad preferably is disposed so as to be overlapped by a second corner portion of the capacitor body, when viewed in a plan, the second corner portion being adjacent to the first corner portion in the lengthwise direction, the third pad preferably is disposed so as to be overlapped by a third corner portion of the capacitor body, when viewed in a plan, the third corner portion being adjacent to the first corner portion in the widthwise direction, and the fourth pad preferably is disposed so as to be overlapped by a fourth corner portion of the capacitor body, when viewed in a plan, the fourth corner portion being adjacent to the third corner portion in the lengthwise direction. Here, the plurality of external electrodes preferably include a first external electrode extending over the first end surface and the first side surface and coupled to the first pad; a second external electrode extending over the second end surface and the first side surface and coupled to the second pad; a third external electrode extending over the first end surface and the second side surface and coupled to the third pad; and a fourth external electrode extending over the second end surface and the second side surface and coupled to the fourth pad. Alternatively, the plurality of external electrodes preferably include a first external electrode, at least a portion of which is located on the first end surface, the first external electrode being coupled to the first and third pads; and a second external electrode, at least a portion of which is located on the second end surface, the second external electrode being coupled to the second and fourth pads.

In the monolithic-capacitor-mounted structure according to each of the first and second aspects of various preferred embodiments of the present invention, preferably, Lx and Wx are equal or substantially equal to each other.

In the monolithic-capacitor-mounted structure according to each of the first and second aspects of various preferred embodiments of the present invention, preferably, Lx/Wx is preferably greater than or equal to about 0.9 but smaller than or equal to about 1.1, for example.

According to various preferred embodiments of the present invention, acoustic noise in a monolithic-capacitor-mounted structure is significantly reduced or prevented.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
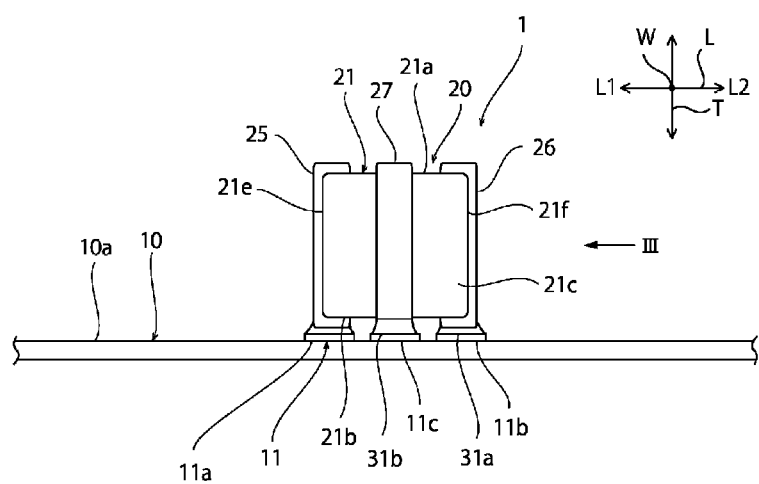
FIG. 1 is a schematic side view of a monolithic-capacitor-mounted structure according to a first preferred embodiment of the present invention.

Hereinbelow, preferred embodiments of the present invention are described. The preferred embodiments described below, however, are mere examples. The present invention is not limited to the preferred embodiments described below.

Throughout the drawings illustrating the preferred embodiments and others, components having the same or substantially the same function are denoted by the same reference symbol. The drawings illustrating the preferred embodiments and others are schematically drawn. Parameters such as the ratio of dimensions of objects drawn in the drawings may be different from parameters such as the ratio of dimensions of actual objects. Parameters such as the ratio of dimensions of objects may differ between the drawings. Specific parameters such as the ratio of dimensions of objects should be determined in consideration of the following description.

First Preferred Embodiment

Figure 2:
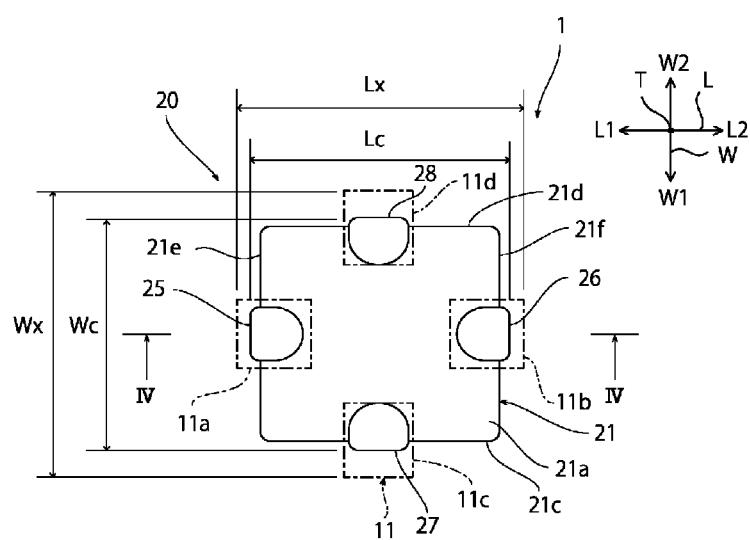
FIG. 2 is a schematic plan view of the monolithic-capacitor-mounted structure according to the first preferred embodiment of the present invention.
Figure 3:
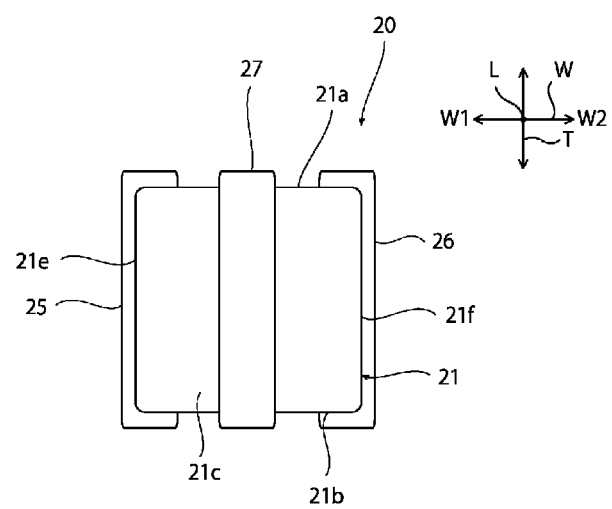
FIG. 3 is a schematic side view of the monolithic capacitor when viewed in the direction of arrow III illustrated in FIG. 1.
Figure 4:
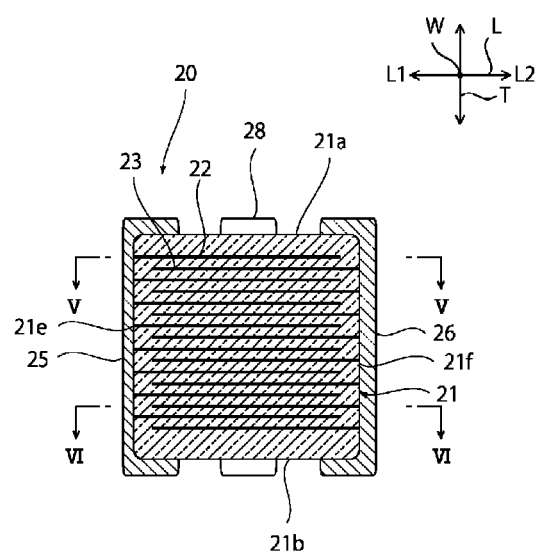
FIG. 4 is a schematic cross-sectional view of the monolithic capacitor taken along the line IV-IV of FIG. 2.
Figure 5:
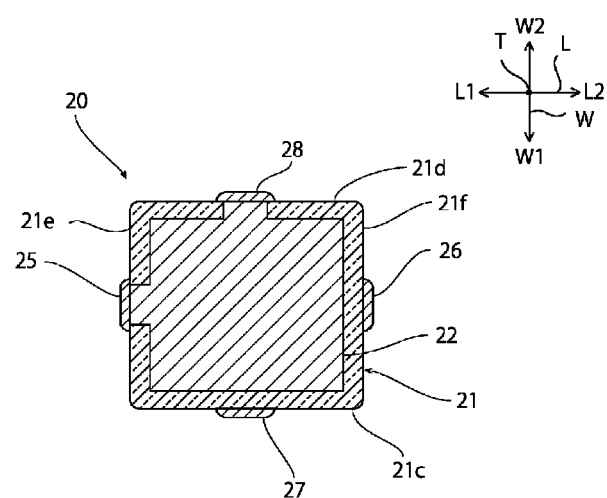
FIG. 5 is a schematic cross-sectional view of the monolithic capacitor taken along the line V-V of FIG. 4.
Figure 6:
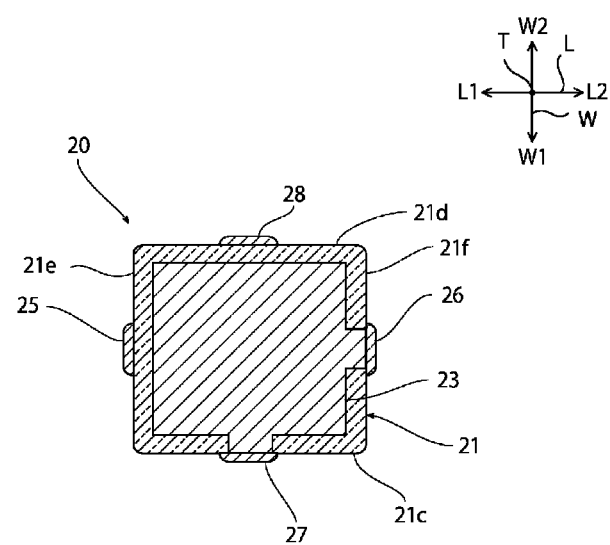
FIG. 6 is a schematic cross-sectional view of the monolithic capacitor taken along the line VI-VI of FIG. 4.

FIG. 1 is a schematic side view of a monolithic-capacitor-mounted structure according to a first preferred embodiment of the present invention. FIG. 2 is a schematic plan view of the monolithic-capacitor-mounted structure according to the first preferred embodiment. FIG. 3 is a schematic side view of a capacitor when viewed in the direction of arrow III illustrated in FIG. 1. FIG. 4 is a schematic cross-sectional view of a capacitor taken along the line IV-IV of FIG. 2. FIG. 5 is a schematic cross-sectional view of the capacitor taken along the line V-V of FIG. 4. FIG. 6 is a schematic cross-sectional view of the capacitor taken along the line VI-VI of FIG. 4.

As illustrated in FIG. 1, a monolithic-capacitor-mounted structure 1 includes a substrate 10 and a monolithic capacitor 20. The substrate 10 is not limited to a particular type of substrate. The substrate 10 preferably is, for example, a resin substrate or a resin substrate containing a filler such as a glass epoxy substrate.

The substrate 10 includes a mount surface 10a, on which multiple pads 11 are mounted. The multiple pads 11 are exposed over the mount surface 10a of the substrate 10. The pads 11 constitute a portion of the conductor pattern. The conductor pattern is appropriately covered by a solder resist while a portion of the conductor pattern remains exposed so that the exposed portions are left for use as the pads 11. As illustrated in FIG. 2, the multiple pads 11 include first to fourth pads 11a, 11b, 11c, and 11d. The first and second pads 11a and 11b at least partially face each other in the lengthwise direction L. The third and fourth pads 11c and 11d are located between the first and second pads 11a and 11b in the lengthwise direction L. The third and fourth pads 11c and 11d at least partially face each other in the widthwise direction W. Thus, the first to fourth pads 11a, 11b, 11c, and 11d are arranged so that a line connecting their respective centers defines a rectangle.

A monolithic capacitor 20 is mounted on the mount surface 10a of the substrate 10. The monolithic capacitor 20 includes a capacitor body 21. In this preferred embodiment, the capacitor body 21 is made of ceramic materials. Thus, the monolithic capacitor 20 is a monolithic ceramic capacitor. Examples of ceramic materials preferably usable as materials of the capacitor body 21 include $BaTiO_3$, $CaTiO_3$, $SrTiO_3$, and $CaZrO_3$.

The capacitor body 21 includes first and second main surfaces 21a and 21b, first and second side surfaces 21c and 21d, and first and second end surfaces 21e and 21f. The first and second main surfaces 21a and 21b extend in the lengthwise direction L and the widthwise direction W. The first and second side surfaces 21c and 21d extend in the lengthwise direction L and the thickness direction T. The first and second end surfaces 21e and 21f extend in the widthwise direction W and the thickness direction T.

As illustrated in FIG. 4, multiple internal electrodes 22 and 23 are disposed inside the capacitor body 21. Specifically, inside the capacitor body 21, first and second internal electrodes 22 and 23 are stacked one on top of the other in the thickness direction T at regular intervals.

As illustrated in FIG. 5, the first internal electrodes 22 are drawn to the second side surface 21d and the first end surface 21e. As illustrated in FIG. 6, the second internal electrodes 23 are drawn to the first side surface 21c and the second end surface 21f. The configuration of the internal electrodes is not particularly limited in the present invention.

The monolithic capacitor 20 includes multiple external electrodes 25 to 28. At least a portion of each of the multiple external electrodes 25 to 28 is disposed on either one of the first and second side surfaces 21c and 21d and the first and second end surfaces 21e and 21f.

Specifically, in this preferred embodiment, at least a portion of the first external electrode 25 is disposed on the first end surface 21e. The first external electrode 25 covers an area extending from the first end surface 21e to the first and second main surfaces 21a and 21b. The first external electrode 25 includes, in addition to a portion located on the first end surface 21e, a portion located on the first main surface 21a and a portion located on the second main surface 21b.

At least a portion of the second external electrode 26 is disposed on the second end surface 21f. The second external electrode 26 covers an area extending from the second end surface 21f to the first and second main surfaces 21a and 21b. The second external electrode 26 includes, in addition to a portion located on the second end surface 21f, a portion located on the first main surface 21a and a portion located on the second main surface 21b.

At least a portion of the third external electrode 27 is disposed on the first side surface 21c. The third external electrode 27 covers an area extending from the first side surface 21c to the first and second main surfaces 21a and 21b. The third external electrode 27 includes, in addition to a portion located on the first side surface 21c, a portion located on the first main surface 21a and a portion located on the second main surface 21b.

At least a portion of the fourth external electrode 28 is disposed on the second side surface 21d. The fourth external electrode 28 covers an area extending from the second side surface 21d to the first and second main surfaces 21a and 21b. The fourth external electrode 28 includes, in addition to a portion located on the second side surface 21d, a portion located on the first main surface 21a and a portion located on the second main surface 21b.

The external electrodes 25 to 28 are each electrically connected to the internal electrodes 22 or 23. Specifically, the first external electrode 25 and the fourth external electrode 28 are electrically connected to the first internal electrodes 22. The second external electrode 26 and the third external electrode 27 are electrically connected to the second internal electrodes 23.

The first to fourth pads 11a to 11d, the first and second internal electrodes 22 and 23, and the external electrodes 25 to 28 preferably is made of appropriate electrically conductive materials. The first to fourth pads 11a to 11d, the first and second internal electrodes 22 and 23, and the external electrodes 25 to 28 each is preferably made of at least one of materials including Pt, Au, Ag, Cu, Ni, and Cr.

As illustrated in FIG. 1, the first to fourth external electrodes 25 to 28 are respectively coupled to and electrically connected to the first to fourth pads 11a, 11b, 11c, and 11d using bonding members 31a and 31b. The bonding member 31a is used to respectively couple and electrically connect the first and second external electrodes 25 and 26 to the first and second pads 11a and 11b. The bonding member 31b is used to respectively couple and electrically connect the third and fourth external electrodes 27 and 28 to the third and fourth pads 11c and 11d.

As illustrated in FIG. 2, specifically in this preferred embodiment, the first pad 11a is located between an end portion of the capacitor body 21 in a first widthwise direction W1, which is included in the widthwise direction W, and an end portion of the capacitor body 21 in a second widthwise direction W2, which is included in the widthwise direction W, when viewed in a plan (when viewed in the thickness direction T). The first pad 11a is overlapped with the first end surface 21e of the capacitor body 21 when viewed in a plan. The first pad 11a is overlapped by the first external electrode 25 when viewed in a plan. The first pad 11a and the first external electrode 25 are coupled and electrically connected together using the bonding member 31a. The first pad 11a preferably is located inwardly of the first end surface 21e toward the inside of the capacitor body 21 when viewed in a plan.

The second pad 11b is located between the end portion of the capacitor body 21 in the first widthwise direction W1 and the end portion of the capacitor body 21 in the second widthwise direction W2 when viewed in a plan. The second pad 11b is overlapped with the second end surface 21f of the capacitor body 21 when viewed in a plan. The second pad 11b is overlapped by the second external electrode 26 when viewed in a plan. The second pad 11b and the second external electrode 26 are coupled and electrically connected together using the bonding member 31a. The second pad 11b preferably is located inwardly of the second end surface 21f toward the inside of the capacitor body 21 when viewed in a plan.

The third pad 11c is located between an end portion of the capacitor body 21 in a first lengthwise direction L1, which is included in the lengthwise direction L, and an end portion of the capacitor body 21 in a second lengthwise direction L2, which is included in the lengthwise direction L, when viewed in a plan. The third pad 11c is overlapped with the first side surface 21c of the capacitor body 21 when viewed in a plan. The third pad 11c is overlapped by the third external electrode 27 when viewed in a plan. The third pad 11c and the third external electrode 27 are coupled and electrically connected together using the bonding member 31b. The third pad 11c preferably is located inwardly of the first side surface 21c toward the inside of the capacitor body 21 when viewed in a plan.

The fourth pad 11d is located between the end portion of the capacitor body 21 in the first lengthwise direction L1 and the end portion of the capacitor body 21 in the second lengthwise direction L2 when viewed in a plan. The fourth pad 11d is overlapped with the second side surface 21d of the capacitor body 21 when viewed in a plan. The fourth pad 11d is overlapped by the fourth external electrode 28 when viewed in a plan. The fourth pad 11d and the fourth external electrode 28 are coupled and electrically connected together using the bonding member 31b. The fourth pad 11d preferably is located inwardly of the second side surface 21d toward the inside of the capacitor body 21 when viewed in a plan.

The bonding members 31a and 31b preferably are made of an appropriate electrically conductive material. The bonding members 31a and 31b preferably are made of a material such as solder, low-melting metal, or resin containing electrically conductive particles.

The monolithic capacitor 20 satisfies the conditions where Lc>Wc and Lx/Wx<Lc/Wc. Here, Lx denotes a distance between an outermost portion of an outermost one of the first to fourth pads 11a to 11d in the first lengthwise direction L1, which is included in the lengthwise direction L, and an outermost portion of an outermost one of the first to fourth pads 11a to 11d in the second lengthwise direction L2, which is included in the lengthwise direction L (in this preferred embodiment, a distance between the outermost portion of the first pad 11a in the first lengthwise direction L1 and the outermost portion of the second pad 11b in the second lengthwise direction L2), in other words, Lx denotes a distance between outermost portions of the first to fourth pads in the lengthwise direction; Wx denotes a distance between an outermost portion of an outermost one of the first to fourth pads 11a to 11d in the first widthwise direction W1, which is included in the widthwise direction W, and an outermost portion of an outermost one of the first to fourth pads 11a to 11d in the second widthwise direction W2, which is included in the widthwise direction W, (in this preferred embodiment, a distance between the outermost portion of the third pad 11c in the first widthwise direction W1 and the outermost portion of the fourth pad 11d in the second widthwise direction W2), in other words, Wx denotes a distance between outermost portions of the first to fourth pads in the widthwise direction; Lc denotes a distance between an outermost portion of an outermost one of the multiple external electrodes 25 to 28 in the first lengthwise direction L1 and an outermost portion of an outermost one of the multiple external electrodes 25 to 28 in the second lengthwise direction L2 (in this preferred embodiment, a distance between the outermost portion of the first external electrode 25 in the first lengthwise direction L1 and the outermost portion of the second external electrode 26 in the second lengthwise direction L2), in other words, Lc denotes a distance between outermost portions of the plurality of external electrodes in the lengthwise direction; and Wc denotes a distance between an outermost portion of an outermost one of the multiple external electrodes 25 to 28 in the first widthwise direction W1 and an outermost portion of an outermost one of the multiple external electrodes 25 to 28 in the second widthwise direction W2 (in this preferred embodiment, a distance between the outermost portion of the third external electrode 27 in the first widthwise direction W1 and the outermost portion of the fourth external electrode 28 in the second widthwise direction W2), in other words, Wc denotes a distance between outermost portions of the plurality of external electrodes in the widthwise direction.

As a result of diligent study, the inventors have discovered that the occurrence of acoustic noise in the monolithic-capacitor-mounted structure 1 is significantly reduced or prevented under these conditions.

Here, Lx/Wx<Lc/Wc can be converted into Lx/Lc<Wx/Wc. In this preferred embodiment, Lx−Lc<Wx−Wc is also true. Thus, the height of the bonding member 31a in the thickness direction T is small while the height of the bonding member 31b in the thickness direction T is large. It is usually believed that as the height of the bonding member is lower, the vibrations of the monolithic capacitor are likely to be transmitted to the substrate to a lesser extent. Thus, persons having ordinary skill in the art are unlikely to conceive of the configuration where Lx/Wx<Lc/Wc, as in the case of this preferred embodiment.

In the case where a monolithic capacitor satisfies the condition where Lc>Wc, the capacitor is bent in the lengthwise direction L to a larger extent than in the widthwise direction W. In the case of a monolithic-capacitor-mounted structure that satisfies the condition where Lx/Wx<Lc/Wc, when viewed in a plan, a portion of a widthwise outermost bonding member, the portion being located outwardly of the external electrode in the widthwise direction, has a larger length than a portion of a lengthwise outermost bonding member, the portion being located outwardly of the external electrode in the lengthwise direction. Thus, the bending of the capacitor in the lengthwise direction L is transmitted to the substrate to a lesser extent than the bending of the capacitor in the widthwise direction W. In a monolithic-capacitor-mounted structure that satisfies the conditions where Lc>Wc and Lx/Wx<Lc/Wc, stresses produced by bending the capacitor in the lengthwise direction L to a large extent are unlikely to be transmitted to the substrate, while stresses produced by bending the capacitor in the widthwise direction W to a small extent are likely to be transmitted to the substrate. Thus, the magnitude of vibrations of the substrate in the lengthwise direction L and the magnitude of vibrations of the substrate in the widthwise direction W approximate to each other and effectively interfere with each other. Consequently, the acoustic noise is significantly reduced or prevented.

In order to more effectively reduce acoustic noise in the monolithic-capacitor-mounted structure 1, it is preferable that Lx and Wx be equal or substantially equal to each other. This is because this structure allows the bending of the monolithic capacitor to be evenly or substantially evenly dispersed in the lengthwise direction L and the widthwise direction W. Here, the condition where Lx and Wx are equal or substantially equal to each other means that Lx/Wx is preferably larger than or equal to about 0.8 but smaller than or equal to about 1.2, for example.

In order to more effectively reduce acoustic noise in the monolithic-capacitor-mounted structure 1, it is preferable that Lx/Wx be preferably larger than or equal to about 0.9 but smaller than or equal to about 1.1, for example.

Hereinbelow, other preferred embodiments of the present invention will be described. In the following description, components having the same or substantially the same functions as the corresponding components according to the first preferred embodiment are denoted by the same symbols and are not redundantly described.

Second Preferred Embodiment

Figure 7:
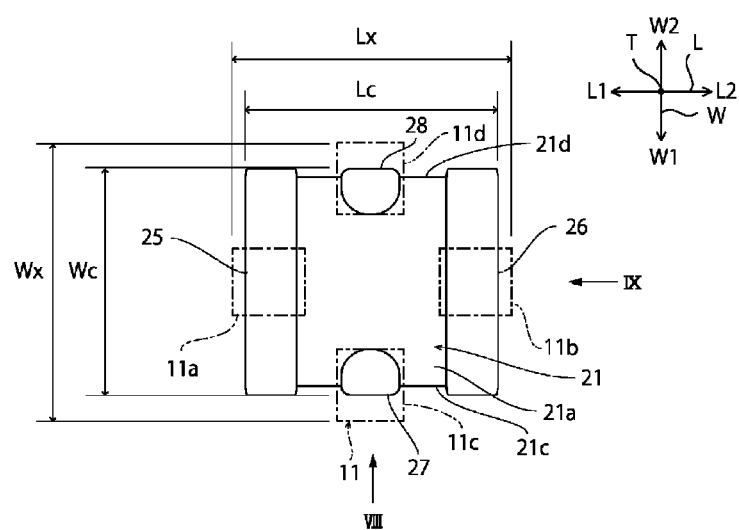
FIG. 7 is a schematic plan view of a monolithic-capacitor-mounted structure according to a second preferred embodiment of the present invention.
Figure 8:
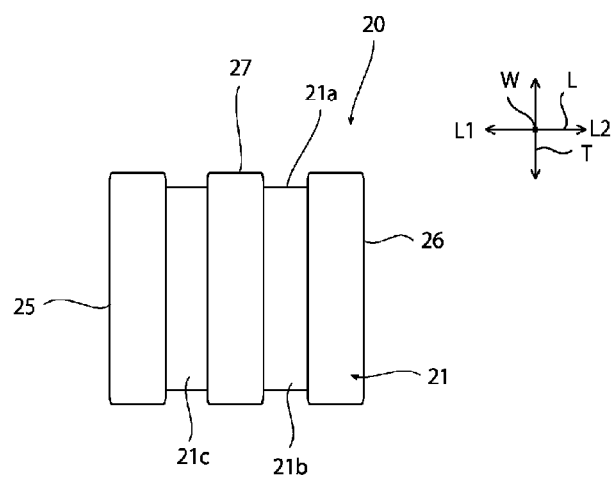
FIG. 8 is a schematic side view of the monolithic capacitor when viewed in the direction of arrow VIII of FIG. 7.
Figure 9:
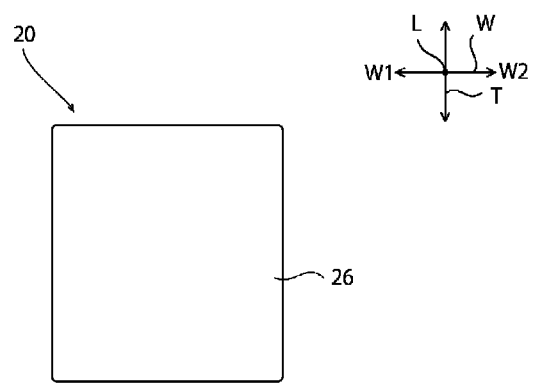
FIG. 9 is a schematic side view of the monolithic capacitor when viewed in the direction of arrow IX of FIG. 7.

FIG. 7 is a schematic plan view of a monolithic-capacitor-mounted structure according to a second preferred embodiment of the present invention. FIG. 8 is a schematic side view of a capacitor when viewed in the direction of arrow VIII of FIG. 7. FIG. 9 is a schematic side view of the capacitor when viewed in the direction of arrow IX of FIG. 7.

In the monolithic capacitor 20 according to the first preferred embodiment, the first and second external electrodes 25 and 26 are not disposed on the first and second side surfaces 21c and 21d. However, the present invention is not limited to this structure.

In the second preferred embodiment, the first external electrode 25 covers an area extending from the first end surface 21e to the first and second main surfaces 21a and 21b and the first and second side surfaces 21c and 21d. The first external electrode 25 includes, besides a portion located on the first end surface 21e, a portion located on the first main surface 21a, a portion located on the second main surface 21b, a portion located on the first side surface 21c, and a portion located on the second side surface 21d.

The second external electrode 26 covers an area extending from the second end surface 21f to the first and second main surfaces 21a and 21b and the first and second side surfaces 21c and 21d. The second external electrode 26 includes, besides a portion located on the second end surface 21f, a portion located on the first main surface 21a, a portion located on the second main surface 21b, a portion located on the first side surface 21c, and a portion located on the second side surface 21d.

As in the case of the first preferred embodiment, this preferred embodiment also enables effective reduction or prevention of acoustic noise.

Third Preferred Embodiment

Figure 10:
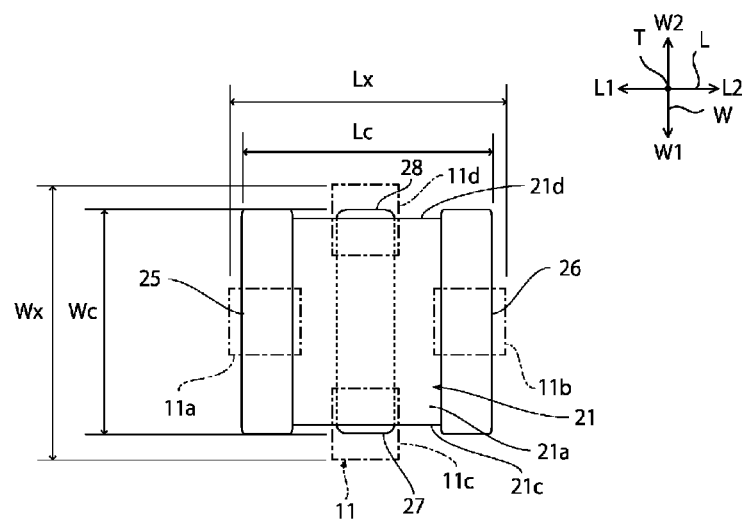
FIG. 10 is a schematic plan view of a monolithic-capacitor-mounted structure according to a third preferred embodiment of the present invention.

FIG. 10 is a schematic plan view of a monolithic-capacitor-mounted structure according to a third preferred embodiment of the present invention.

The monolithic-capacitor-mounted structure according to the third preferred embodiment differs from the capacitor-mounted structure 1 according to the first preferred embodiment in that the third external electrode 27 and the fourth external electrode are electrically connected together and in terms of the configuration of the first and second internal electrodes 22 and 23.

In this preferred embodiment, the third external electrode 27 and the fourth external electrode 28 are connected together on the second main surface 21b. The first internal electrodes 22 are electrically connected to the first and second external electrodes 25 and 26. The second internal electrodes 23 are electrically connected to the third and fourth external electrodes 27 and 28.

As in the case of the first preferred embodiment, this preferred embodiment also enables effective reduction or prevention of acoustic noise.

Fourth Preferred Embodiment

Figure 11:
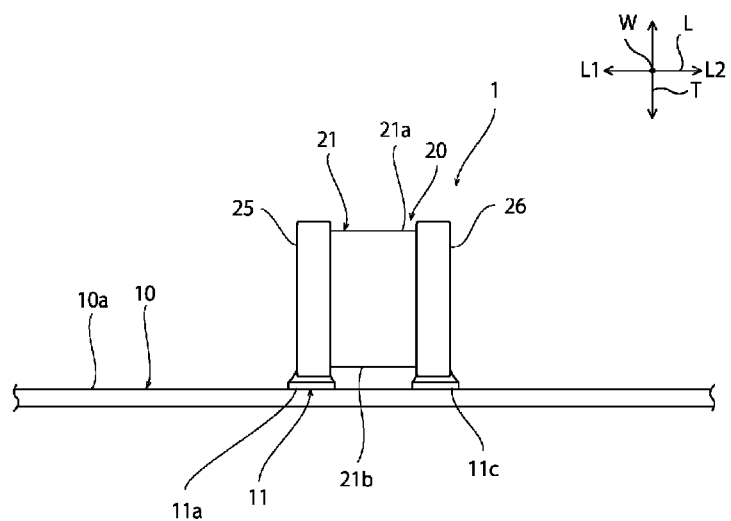
FIG. 11 is a schematic side view of a monolithic-capacitor-mounted structure according to a fourth preferred embodiment of the present invention.
Figure 12:
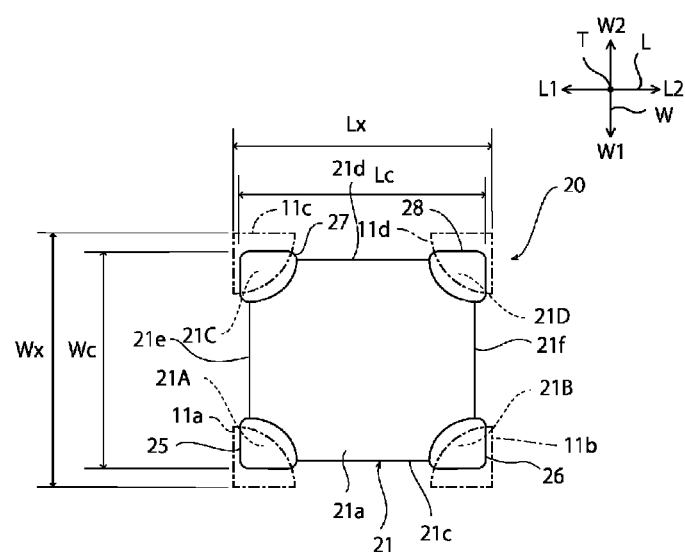
FIG. 12 is a schematic plan view of the monolithic-capacitor-mounted structure according to the fourth preferred embodiment of the present invention.

FIG. 11 is a schematic side view of a monolithic-capacitor-mounted structure according to a fourth preferred embodiment of the present invention. FIG. 12 is a schematic plan view of the monolithic-capacitor-mounted structure according to the fourth preferred embodiment.

The capacitor-mounted structure according to the fourth preferred embodiment differs from the capacitor-mounted structure according to the first preferred embodiment in terms of the configuration of the first to fourth pads 11a to 11d and the first to fourth external electrodes 25 to 28.

The first pad 11a and the second pad 11b at least partially face each other in the lengthwise direction L. The first pad 11a and the third pad 11c at least partially face each other in the widthwise direction W. The second pad 11b and the fourth pad 11d at least partially face each other in the widthwise direction W. The third pad 11c and the fourth pad 11d at least partially face each other in the lengthwise direction L.

In this preferred embodiment, the first external electrode 25 extends over the first end surface 21e and the first side surface 21c. The first external electrode 25 is disposed on a ridge portion defined by the first end surface 21e and the first side surface 21c.

The second external electrode 26 extends over the second end surface 21f and the first side surface 21c. The second external electrode 26 is disposed on a ridge portion defined by the second end surface 21f and the first side surface 21c.

The third external electrode 27 extends over the first end surface 21e and the second side surface 21d. The third external electrode 27 is disposed on a ridge portion defined by the first end surface 21e and the second side surface 21d.

The fourth external electrode 28 extends over the second end surface 21f and the second side surface 21d. The fourth external electrode 28 is disposed on a ridge portion defined by the second end surface 21f and the second side surface 21d.

The first pad 11a is coupled to the first external electrode 25. The first pad 11a is disposed so as to be overlapped, when viewed in a plan, by a first corner portion 21A defined by the first end surface 21e and the first side surface 21c of the capacitor body 21. When viewed in a plan, the first pad 11a is disposed so as to be overlapped by the first external electrode 25.

The second pad 11b is coupled to the second external electrode 26. The second pad 11b is disposed so as to be overlapped, when viewed in a plan, by a second corner portion 21B defined by the second end surface 21f and the first side surface 21c of the capacitor body 21.

The third pad 11c is coupled to the third external electrode 27. The third pad 11c is disposed so as to be overlapped, when viewed in a plan, by a third corner portion 21C defined by the first end surface 21e and the second side surface 21d of the capacitor body 21.

The fourth pad 11d is coupled to the fourth external electrode 28. The fourth pad 11d is disposed so as to be overlapped, when viewed in a plan, by a fourth corner portion 21D defined by the second end surface 21f and the second side surface 21d of the capacitor body 21.

As in the case of the first preferred embodiment, this preferred embodiment also enables effective reduction or prevention of acoustic noise.

Fifth Preferred Embodiment

Figure 13:
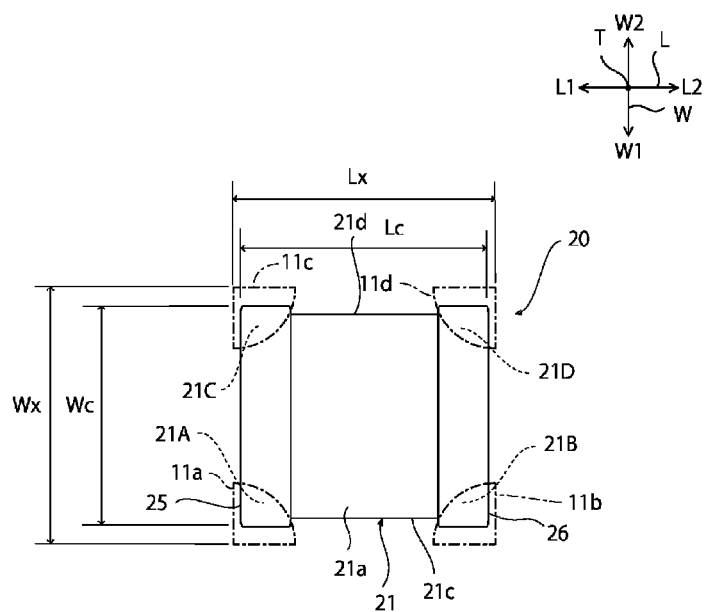
FIG. 13 is a schematic plan view of a monolithic-capacitor-mounted structure according to a fifth preferred embodiment of the present invention.

FIG. 13 is a schematic plan view of a monolithic-capacitor-mounted structure according to a fifth preferred embodiment of the present invention.

The monolithic-capacitor-mounted structure according to the fifth preferred embodiment differs from the monolithic-capacitor-mounted structure according to the first preferred embodiment in terms of the configuration of the external electrodes.

In this preferred embodiment, a monolithic capacitor 20 only includes first and second external electrodes 25 and 26. The first external electrode 25 covers an area extending from the first end surface 21e to the first and second main surfaces 21a and 21b and the first and second side surfaces 21c and 21d. The first external electrode 25 includes, besides a portion located on the first end surface 21e, a portion located on the first main surface 21a, a portion located on the second main surface 21b, a portion located on the first side surface 21c, and a portion located on the second side surface 21d.

The first external electrode 25 is coupled to the first and third pads 11a and 11c.

The second external electrode 26 covers an area extending from the second end surface 21f to the first and second main surfaces 21a and 21b and the first and second side surfaces 21c and 21d. The second external electrode 26 includes, besides a portion located on the second end surface 21f, a portion located on the first main surface 21a, a portion located on the second main surface 21b, a portion located on the first side surface 21c, and a portion located on the second side surface 21d.

The second external electrode 26 is coupled to the second and fourth pads 11b and 11d.

As in the case of the first preferred embodiment, this preferred embodiment also enables effective reduction or prevention of acoustic noise.

First and Second Modified Examples

Figure 14:
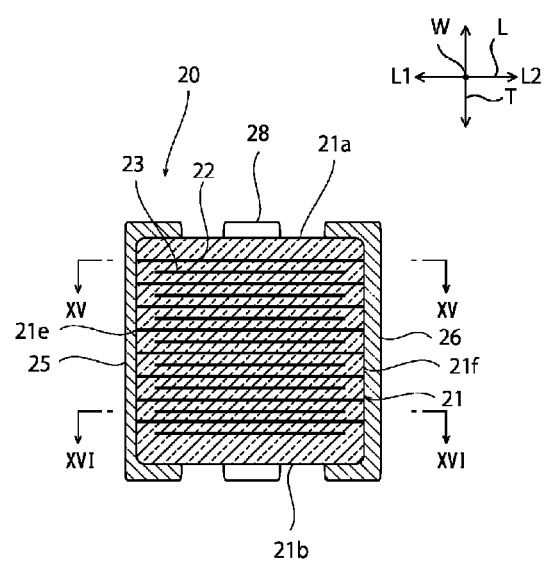
FIG. 14 is a schematic cross-sectional view of a monolithic capacitor according to a first modified example of a preferred embodiment of the present invention.
Figure 15:
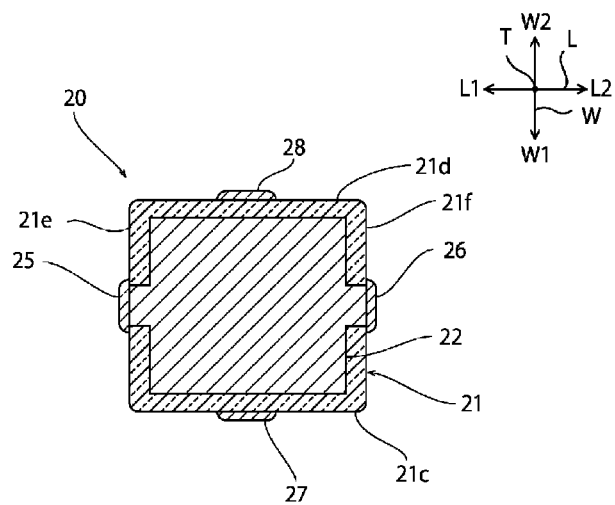
FIG. 15 is a schematic cross-sectional view of the monolithic capacitor taken along the line XV-XV of FIG. 14.
Figure 16:
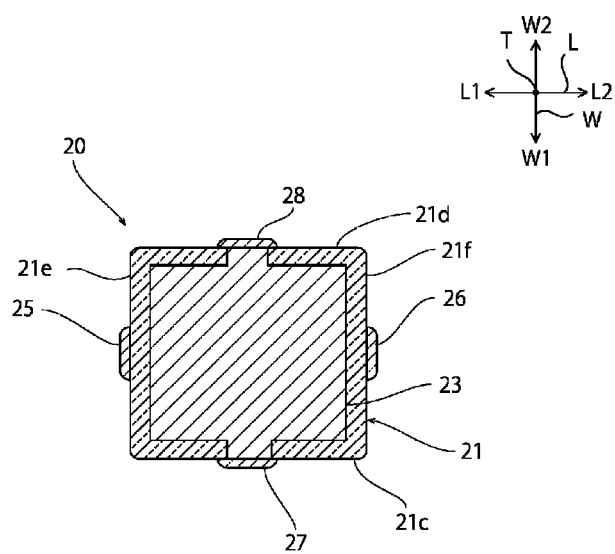
FIG. 16 is a schematic cross-sectional view of the monolithic capacitor taken along the line XVI-XVI of FIG. 14.

FIG. 14 is a schematic cross-sectional view of a monolithic capacitor according to a first modified example of a preferred embodiment of the present invention. FIG. 15 is a schematic cross-sectional view of the monolithic capacitor taken along the line XV-XV of FIG. 14. FIG. 16 is a schematic cross-sectional view of the monolithic capacitor taken along the line XVI-XVI of FIG. 14.

Figure 17:
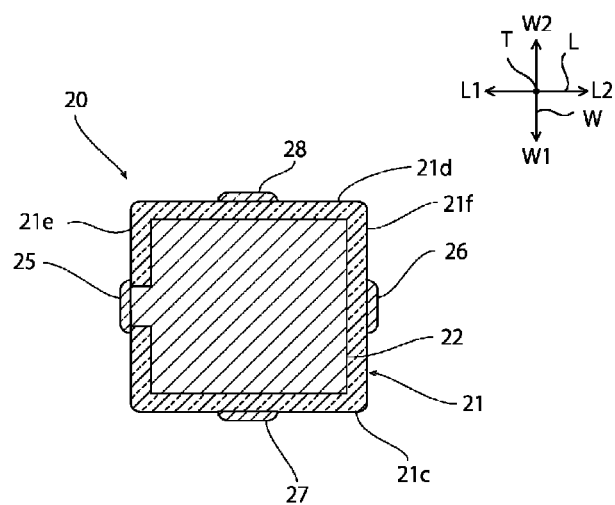
FIG. 17 is a schematic cross-sectional view of a monolithic capacitor according to a second modified example of a preferred embodiment of the present invention.
Figure 18:
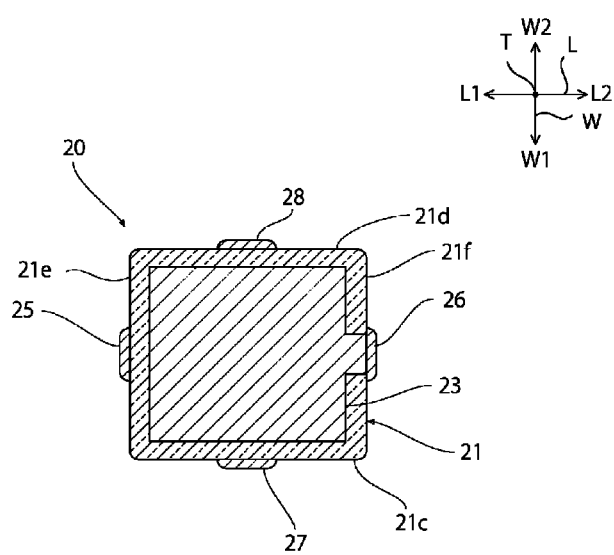
FIG. 18 is a schematic cross-sectional view of the monolithic capacitor according to the second modified example of a preferred embodiment of the present invention.

FIG. 17 is a schematic cross-sectional view of a monolithic capacitor according to a second modified example of a preferred embodiment of the present invention. FIG. 18 is a schematic cross-sectional view of the monolithic capacitor according to the second modified example.

The first preferred embodiment describes the case where the first internal electrodes 22 are connected to the first and fourth external electrodes 25 and 28 and the second internal electrodes 23 are connected to the second and third external electrodes 26 and 27. However, the configuration of the internal electrodes is not particularly limited in the present invention.

For example, as in the case of a monolithic capacitor 20 according to a first modified example illustrated in FIGS. 14 to 16, the first internal electrodes 22 preferably extend to the first and second end surfaces 21e and 21f and are connected to the first and second external electrodes 25 and 26. The second internal electrodes 23 preferably extend to the first and second side surfaces 21c and 21d and are connected to the third and fourth external electrodes 27 and 28.

As in the case of the monolithic capacitor 20 according to the first modified example, in a monolithic capacitor according to any one of the second to fourth preferred embodiments, the first internal electrodes preferably are connected to the first and second external electrodes and the second internal electrodes preferably are connected to the third and fourth external electrodes.

For example, as in the case of a monolithic capacitor 20 according to a second modified example illustrated in FIGS. 17 and 18, the first internal electrodes 22 preferably extend to the first end surface 21e and are connected to the first external electrode 25. The second internal electrodes 23 preferably extend the second end surface 21f and are connected to the second external electrode 26. The third and fourth external electrodes 27 and 28 preferably is not connected to internal electrodes. As described above, in various preferred embodiments of the present invention, at least one of the first to fourth external electrodes preferably is not connected to internal electrodes.

As in the case of the monolithic capacitor according to the second modified example, in a monolithic capacitor according to any one of the second to fourth preferred embodiments, the first internal electrodes preferably are connected to the first external electrode, the second internal electrodes preferably are connected to the second external electrode, and the third and fourth external electrodes preferably are not connected to internal electrodes.

Although the connection relationship between internal electrodes and external electrodes is changed, the acoustic-noise effect remains the same without any change as long as the positional relationship between the internal electrodes and the external electrodes remains the same.

Hereinbelow, the present invention is described in detail on the basis of specific non-limiting examples. The present invention is, however, not limited to the following examples and can be embodied in various manners within the scope not departing from the gist of the present invention.

Comparative Example

A monolithic-capacitor-mounted structure that has substantially the same configuration as the monolithic-capacitor-mounted structure according to the first preferred embodiment was fabricated so as to satisfy the following conditions:
 Lc of 0.99 mm;
 Wc of 0.58 mm;
 Lc/Wc of approximately 1.7;
 the capacitance of the monolithic capacitor of approximately 4.3 μF;
 Lx of 1.3 mm;
 Wx of 0.75 mm; and
 Lx/Wx of approximately 1.7.

Example 1

A monolithic-capacitor-mounted structure that has substantially the same configuration as the monolithic-capacitor-mounted structure according to the comparative example was fabricated except that the following conditions are changed:
 Lx of 1.1 mm;
 Wx of 0.75 mm; and
 Lx/Wx of approximately 1.5.

Example 2

A monolithic-capacitor-mounted structure that has substantially the same configuration as the monolithic-capacitor-mounted structure according to the comparative example was fabricated except that the following conditions are changed:
 Lx of 1.3 mm;
 Wx of 1.1 mm; and
 Lx/Wx of approximately 1.2.

Example 3

A monolithic-capacitor-mounted structure that has substantially the same configuration as the monolithic-capacitor-mounted structure according to the comparative example was fabricated except that the following conditions are changed:
 Lx of 1.1 mm;
 Wx of 1.1 mm; and
 Lx/Wx of approximately 1.0.

Evaluation

Figure 19:
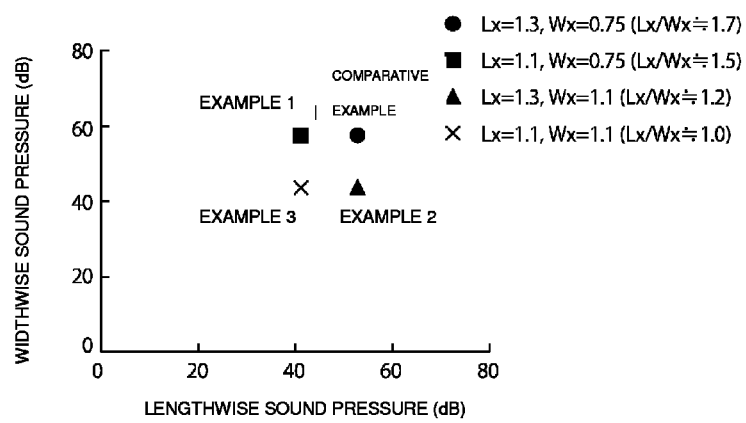
FIG. 19 is a graph showing the sound pressures of acoustic noise in capacitors according to Examples 1 to 3 and a comparative example.

While a voltage of 3 V DC and 1 Vp-p AC was applied to each of the monolithic-capacitor-mounted structures fabricated according to Examples 1 to 3 and the comparative example, the maximum sound pressure of vibrations in the lengthwise direction L and the maximum sound pressure of vibrations in the widthwise direction W in the frequency range of 1 kHz to 6 kHz were measured. FIG. 19 illustrates the results of measurement.

The results illustrated in FIG. 19 show that the sound pressure of acoustic noise in the case where Lx/Wx<Lc/Wc is lower than that in the case where Lx/Wx is equal or substantially equal to Lc/Wc. The results also show that the sound pressure of acoustic noise is further lowered by reducing the difference between Lx and Wx. The results thus show that it is further preferable that Lx and Wx be equal or substantially equal to each other.

Example 4

A monolithic-capacitor-mounted structure that has substantially the same configuration as the monolithic-capacitor-mounted structure according to the first preferred embodiment was fabricated so as to satisfy the following conditions:
 Lc of 0.99 mm;
 Wc of 0.55 mm;
 Lc/Wc of approximately 1.8;
 the capacitance of the monolithic capacitor of approximately 4.3 μF;
 Lx of 0.99 mm (Lc=Lx);
 Wx of 0.58 mm (Wc=0.95 Wx); and
 Lx/Wx of approximately 1.7.

Example 5

A monolithic-capacitor-mounted structure that has substantially the same configuration as the monolithic-capacitor-mounted structure according to the comparative example was fabricated except that the following conditions are changed:
 Lc of 0.89 mm;
 Wc of 0.61 mm;
 Lc/Wc of approximately 1.5;
 Lx of 0.89 mm (Lc=Lx);
 Wx of 0.64 mm (Wc=0.95 Wx); and
 Lx/Wx of approximately 1.4.

Example 6

A monolithic-capacitor-mounted structure that has substantially the same configuration as the monolithic-capacitor-mounted structure according to the comparative example was fabricated except that the following conditions are changed:

Lc of 0.79 mm;
Wc of 0.67 mm;
Lc/Wc of approximately 1.2;
Lx of 0.79 mm (Lc=Lx);
Wx of 0.71 mm (Wc=0.95 Wx); and
Lx/Wx of 1.1.

Example 7

A monolithic-capacitor-mounted structure that has substantially the same configuration as the monolithic-capacitor-mounted structure according to the comparative example was fabricated except that the following conditions are changed:
Lc of 0.77 mm;
Wc of 0.69 mm;
Lc/Wc of 1.12;
Lx of 0.77 mm (Lc=Lx);
Wx of 0.73 mm (Wc=0.95 Wx); and
Lx/Wx of approximately 1.05.

Example 8

A monolithic-capacitor-mounted structure that has substantially the same configuration as the monolithic-capacitor-mounted structure according to the comparative example was fabricated except that the following conditions are changed:
Lc of 0.75 mm;
Wc of 0.71 mm;
Lc/Wc of approximately 1.06;
Lx of 0.75 mm (Lc=Lx);
Wx of 0.75 mm (Wc=0.95 Wx); and
Lx/Wx of approximately 1.0.

These dimensions were obtained by observing capacitor-mounted structure samples from above the substrate using a digital microscope and by averaging the dimensions of three measured samples.

Evaluation

Figure 20:
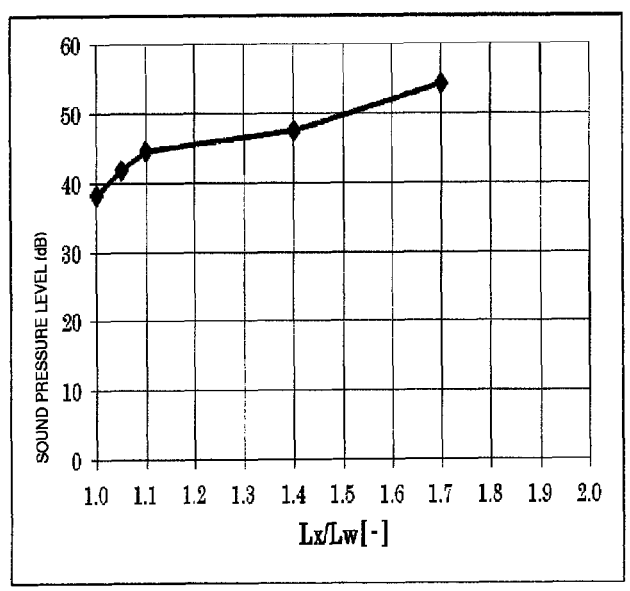
FIG. 20 is a graph showing the relationship between the Lx/Lw and the sound pressure of acoustic noise in capacitors according to Examples 4 to 8.
Figure 21:
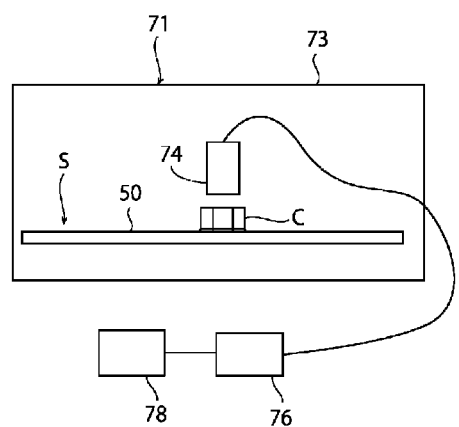
FIG. 21 is a schematic view of an acoustic-noise measuring device.

While a voltage of 3 V DC and 1 Vp-p AC was applied to each of the monolithic-capacitor-mounted structures fabricated according to Examples 4 to 8, the maximum sound pressure of vibrations in the frequency range of 1 kHz to 6 kHz was measured. Specifically, as illustrated in FIG. 21, a sample S was fabricated by mounting a monolithic capacitor C on a mount substrate 50 using solder. Subsequently, the sample S was placed in an anechoic box 73 of a measurement device 71 and a voltage of 1 Vpp AC in the frequency range of 1 kHz to 6 kHz was applied to the monolithic capacitor C. In this state, acoustic noise was collected using a sound-collecting microphone 74 disposed 3 mm above the monolithic capacitor C of the sample S. Then, the sound pressure level of the sound collected by a sound collector 76 and a fast Fourier transform (FFT) analyzer 78 was measured and the sound pressures of three samples S were averaged to calculate the average pressure level. FIG. 20 illustrates the measurement results.

The results illustrated in FIG. 20 show that Lx/Wx is preferably about 1.2 or lower and more preferably about 1.1 or lower, for example, in view of acoustic noise reduction.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A monolithic-capacitor-mounted structure, comprising:
a monolithic capacitor; and
a substrate including a mount surface on which the monolithic capacitor is mounted; wherein
the monolithic capacitor includes:
a capacitor body including first and second main surfaces parallel or substantially parallel to the mount surface and extending in a lengthwise direction and a widthwise direction, first and second side surfaces perpendicular or substantially perpendicular to the mount surface and extending in a thickness direction and the lengthwise direction, and first and second end surfaces extending in the thickness direction and the widthwise direction;
a plurality of internal electrodes disposed inside the capacitor body; and
a plurality of external electrodes each electrically connected to any of the internal electrodes, at least a portion of each of the external electrodes being disposed on at least any one of the side surfaces and the end surfaces of the capacitor body; wherein
a plurality of pads coupled to at least one of the external electrodes via a bonding member are disposed on the mount surface of the substrate;
the plurality of pads include:
first and second pads that at least partially face each other in the lengthwise direction; and
third and fourth pads that are disposed between the first pad and the second pad in the lengthwise direction and that at least partially face each other in the widthwise direction; and $Lc > Wc$ and $Lx/Wx < Lc/Wc$ where:

Lx denotes a distance between outermost portions of the first, second, third and fourth pads in the lengthwise direction;
Wx denotes a distance between outermost portions of the first, second, third and fourth pads in the widthwise direction;
Lc denotes a distance between outermost portions of the plurality of external electrodes in the lengthwise direction; and
Wc denotes a distance between outermost portions of the plurality of external electrodes in the widthwise direction.

2. The monolithic-capacitor-mounted structure according to claim 1, wherein
when viewed in a plan, the first and second pads are located between one end of the capacitor body in the widthwise direction and the other end of the capacitor body in the widthwise direction; and
when viewed in a plan, the third and fourth pads are located between one end of the capacitor body in the lengthwise direction and the other end of the capacitor body in the lengthwise direction.

3. The monolithic-capacitor-mounted structure according to claim 2, wherein the plurality of external electrodes include:
a first external electrode, at least a portion of which is located on the first end surface; and
a second external electrode, at least a portion of which is located on the second end surface; wherein
the first external electrode is coupled to the first pad, and the second external electrode is coupled to the second pad.

4. The monolithic-capacitor-mounted structure according to claim 3, wherein the plurality of external electrodes further include:
- a third external electrode, at least a portion of which is located on the first side surface; and
- a fourth external electrode, at least a portion of which is located on the second side surface; wherein
- the third external electrode is coupled to the third pad, and the fourth external electrode is coupled to the fourth pad.

5. The monolithic-capacitor-mounted structure according to claim 4, wherein the third external electrode and the fourth external electrode are connected to each other on the second main surface.

6. The monolithic-capacitor-mounted structure according to claim 1, wherein first and second ones of the plurality of external electrodes are not disposed on the first and second side surfaces.

7. The monolithic-capacitor-mounted structure according to claim 1, wherein a first one of the plurality of external electrodes covers an area extending from the first end surface to the first and second main surfaces and the first and second side surfaces, and a second one of the plurality of external electrodes covers an area extending from the second end surface to the first and second main surfaces and the first and second side surfaces.

8. The monolithic-capacitor-mounted structure according to claim 1, wherein third and fourth ones of the plurality of external electrodes are connected together on the second main surface, first ones of the plurality of internal electrodes are electrically connected to first and second ones of the plurality of external electrodes, and second ones of the plurality of internal electrodes are electrically connected to the third and fourth external electrodes.

9. The monolithic-capacitor-mounted structure according to claim 1, wherein the first pad and the second pad at least partially face each other in the lengthwise direction, the first pad and the third pad at least partially face each other in the widthwise direction, the second pad and the fourth pad at least partially face each other in the widthwise direction, and the third pad and the fourth pad at least partially face each other in the lengthwise direction.

10. The monolithic-capacitor-mounted structure according to claim 1, wherein the plurality of internal electrodes includes first internal electrodes that extend to the first and second end surfaces and are connected to first and second ones of the plurality of external electrodes, and second internal electrodes that extend to the first and second side surfaces and are connected to third and fourth ones of the plurality of external electrodes.

11. The monolithic-capacitor-mounted structure according to claim 1, wherein the plurality of internal electrodes includes first internal electrodes that extend to the first end surface and are connected to a first one of the plurality of external electrodes, and second internal electrodes that extend to the second end surface and are connected to a second one of the plurality of external electrodes.

12. The monolithic-capacitor-mounted structure according to claim 11, wherein third and fourth ones of the plurality of external electrodes are not connected to any of the plurality of internal electrodes.

13. The monolithic-capacitor-mounted structure according to claim 1, wherein Lx and Wx are equal or substantially equal to each other.

14. The monolithic-capacitor-mounted structure according to claim 13, wherein Lx/Wx is greater than or equal to about 0.9 but smaller than or equal to about 1.1.

15. A monolithic-capacitor-mounted structure, comprising:
- a monolithic capacitor; and
- a substrate including a mount surface on which the monolithic capacitor is mounted; wherein
- the monolithic capacitor includes:
  - a capacitor body including first and second main surfaces parallel or substantially parallel to the mount surface and extending in a lengthwise direction and a widthwise direction, first and second side surfaces perpendicular or substantially perpendicular to the mount surface and extending in a thickness direction and the lengthwise direction, and first and second end surfaces extending in the thickness direction and the widthwise direction;
  - a plurality of internal electrodes disposed inside the capacitor body; and
  - a plurality of external electrodes each electrically connected to any of the internal electrodes, at least a portion of each of the external electrodes being disposed on at least any one of the side surfaces and the end surfaces of the capacitor body; wherein
- a plurality of pads coupled to at least one of the external electrodes via a bonding member are disposed on the mount surface of the substrate;
- the plurality of pads include:
  - first and second pads that at least partially face each other in the lengthwise direction;
  - a third pad that at least partially faces the first pad in the widthwise direction; and
  - a fourth pad that at least partially faces the second pad in the widthwise direction and that at least partially faces the third pad in the lengthwise direction; and $Lc > Wc$ and $Lx/Wx < Lc/Wc$ where:

Lx denotes a distance between outermost portions of the first, second, third and fourth pads in the lengthwise direction;

Wx denotes a distance between outermost portions of the first, second, third and fourth pads in the widthwise direction;

Lc denotes a distance between outermost portions of the plurality of external electrodes in the lengthwise direction; and Wc denotes a distance between outermost portions of the plurality of external electrodes in the widthwise direction.

16. The monolithic-capacitor-mounted structure according to claim 15, wherein
- when viewed in a plan, the first pad is disposed so as to be overlapped by a first corner portion of the capacitor body;
- when viewed in a plan, the second pad is disposed so as to be overlapped by a second corner portion of the capacitor body, the second corner portion being adjacent to the first corner portion in the lengthwise direction;
- when viewed in a plan, the third pad is disposed so as to be overlapped by a third corner portion of the capacitor body, the third corner portion being adjacent to the first corner portion in the widthwise direction; and
- when viewed in a plan, the fourth pad is disposed so as to be overlapped by a fourth corner portion of the capacitor body, the fourth corner portion being adjacent to the third corner portion in the lengthwise direction.

17. The monolithic-capacitor-mounted structure according to claim 16, wherein the plurality of external electrodes include:
- a first external electrode extending over the first end surface and the first side surface and coupled to the first pad;
- a second external electrode extending over the second end surface and the first side surface and coupled to the second pad;
- a third external electrode extending over the first end surface and the second side surface and coupled to the third pad; and
- a fourth external electrode extending over the second end surface and the second side surface and coupled to the fourth pad.

18. The monolithic-capacitor-mounted structure according to claim 16, wherein the plurality of external electrodes include:
- a first external electrode, at least a portion of which is located on the first end surface, the first external electrode being coupled to the first and third pads; and
- a second external electrode, at least a portion of which is located on the second end surface, the second external electrode being coupled to the second and fourth pads.

19. The monolithic-capacitor-mounted structure according to claim 15, wherein Lx and Wx are equal or substantially equal to each other.

20. The monolithic-capacitor-mounted structure according to claim 19, wherein Lx/Wx is greater than or equal to about 0.9 but smaller than or equal to about 1.1.

\* \* \* \* \*